US012336443B2

(12) United States Patent
Liu et al.

(10) Patent No.: US 12,336,443 B2
(45) Date of Patent: Jun. 17, 2025

(54) RESISTIVE RANDOM ACCESS MEMORY AND METHOD FOR MANUFACTURING THE SAME

(71) Applicant: Winbond Electronics Corp., Taichung (TW)

(72) Inventors: Chi-Ching Liu, Taichung (TW); Chih-Chao Huang, Taichung (TW); Shih-Ning Tsai, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 568 days.

(21) Appl. No.: 17/571,149

(22) Filed: Jan. 7, 2022

(65) Prior Publication Data
US 2023/0225228 A1    Jul. 13, 2023

(51) Int. Cl.
*H10N 70/00* (2023.01)
*H10B 63/00* (2023.01)

(52) U.S. Cl.
CPC ......... *H10N 70/8418* (2023.02); *H10B 63/30* (2023.02); *H10B 63/80* (2023.02); *H10N 70/063* (2023.02)

(58) Field of Classification Search
CPC .. H10N 70/8418; H10N 70/063; H10B 63/30; H10B 63/80; H01L 45/1675; H01L 27/2463; H01L 27/2436; H01L 45/1273
See application file for complete search history.

(56) References Cited

U.S. PATENT DOCUMENTS

| | | | |
|---|---|---|---|
| 2016/0204343 A1* | 7/2016 | Gotti | H10N 70/245 257/4 |
| 2018/0061890 A1* | 3/2018 | Tada | H10N 70/883 |
| 2019/0229264 A1* | 7/2019 | Karpov | H10N 70/826 |
| 2020/0020847 A1 | 1/2020 | Lee et al. | |
| 2020/0090944 A1* | 3/2020 | Lee | H01L 21/02063 |
| 2021/0305160 A1* | 9/2021 | Chen | H01L 23/53242 |

FOREIGN PATENT DOCUMENTS

| | | |
|---|---|---|
| TW | I-713029 B | 12/2020 |
| TW | I718256 B | 2/2021 |
| TW | I-732232 B | 7/2021 |

* cited by examiner

*Primary Examiner* — William B Partridge
*Assistant Examiner* — David Paul Sedorook
(74) *Attorney, Agent, or Firm* — Muncy, Geissler, Olds & Lowe, P.C.

(57) ABSTRACT

A resistive random access memory is provided. The resistive random access memory includes a conductive line structure and a memory unit. The conductive line structure is disposed in an array area and a periphery circuit area. The memory unit is disposed on the conductive line structure in the array area. The memory unit includes a lower electrode, a resistive switching layer, and an upper electrode. The lower electrode is disposed on the conductive line structure. The resistive switching layer is disposed on the lower electrode. The upper electrode is disposed on the resistive switching layer. The upper surface of the conductive line structure is in direct contact with the lower electrode.

9 Claims, 12 Drawing Sheets

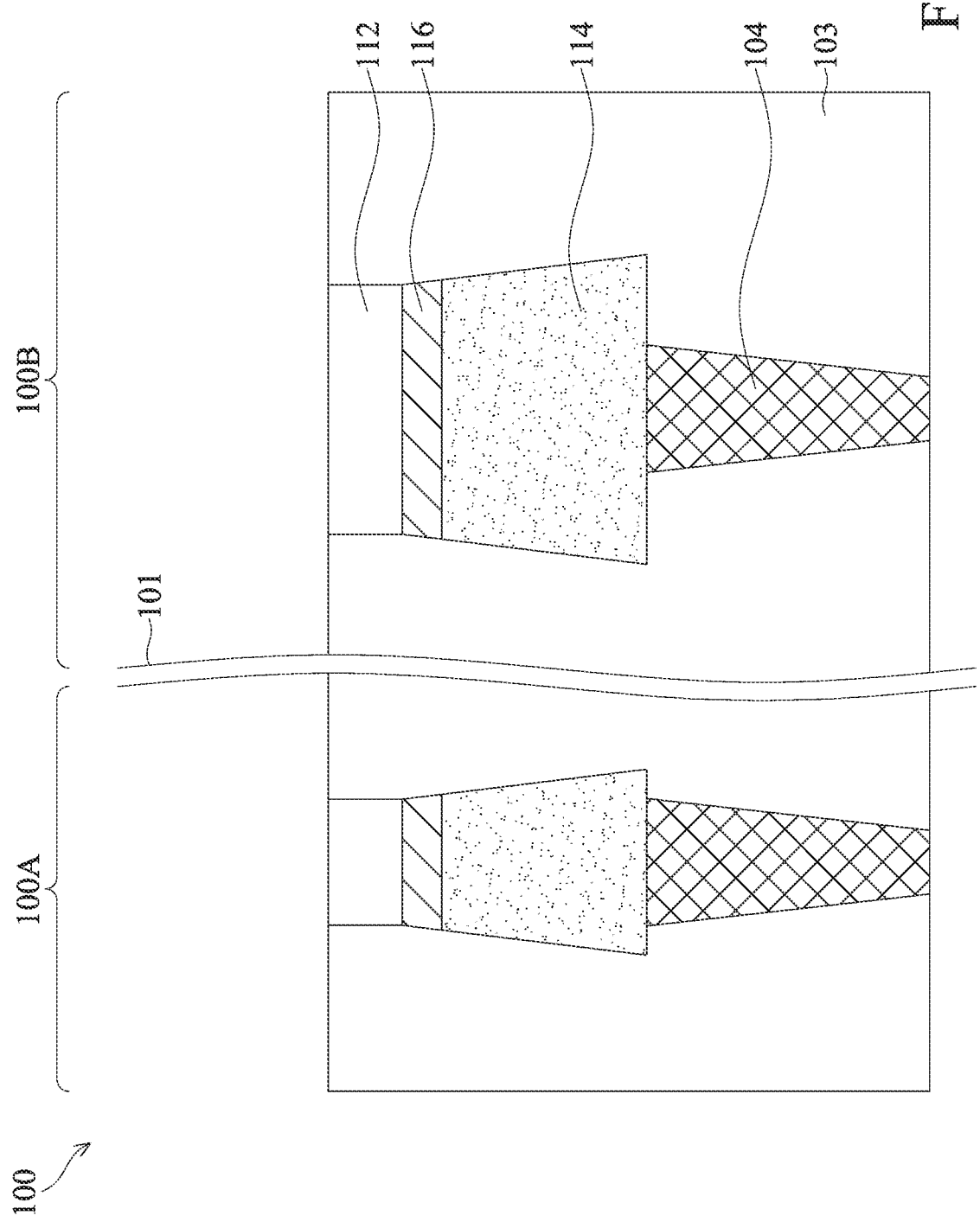

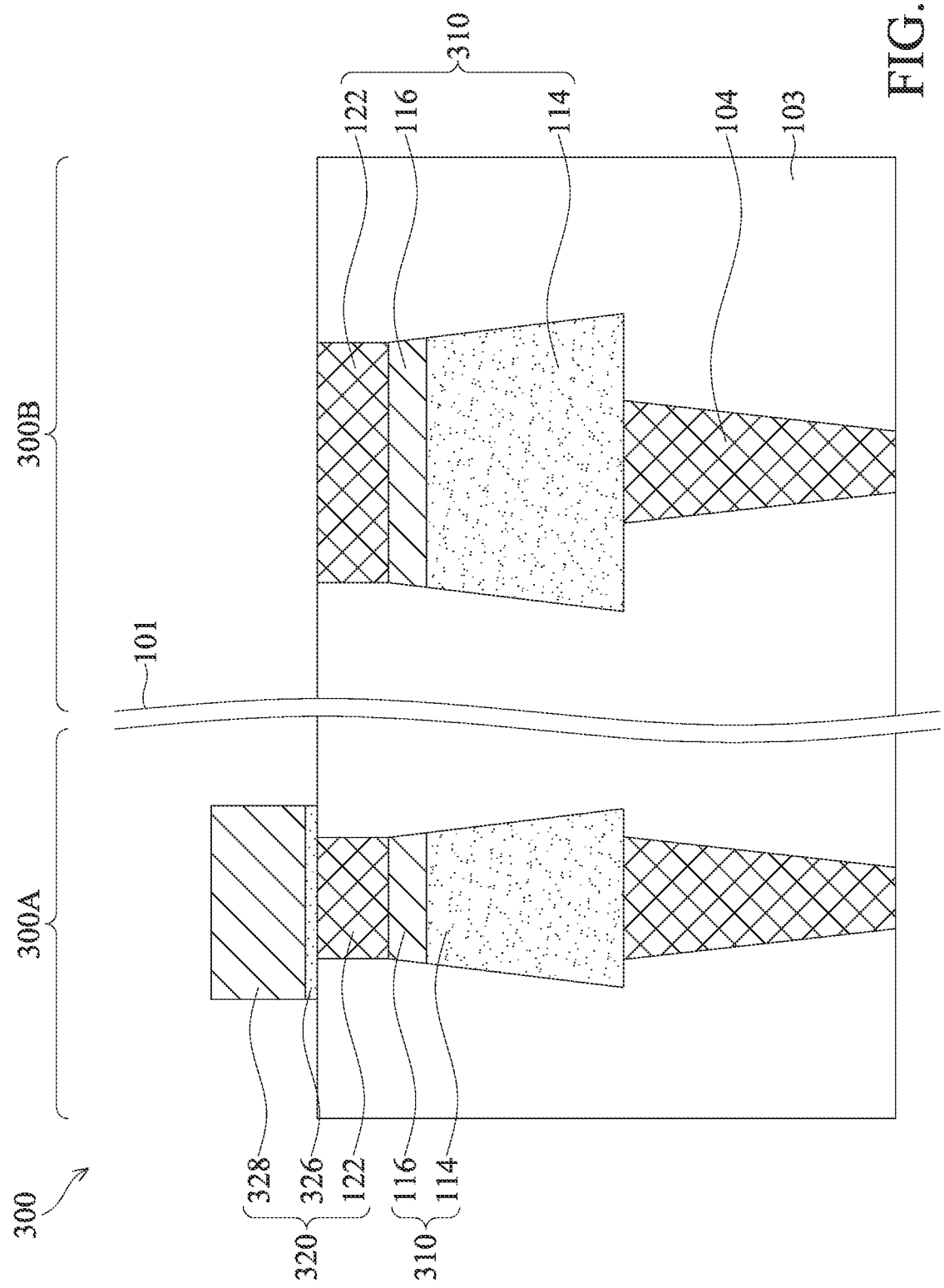

RESISTIVE RANDOM ACCESS MEMORY AND METHOD FOR MANUFACTURING THE SAME

BACKGROUND

Technical Field

The present disclosure relates to semiconductor manufacturing techniques, and in particular it relates to a resistive random access memory and a method for manufacturing the same.

Description of the Related Art

Resistive random access memory (RRAM) has the advantages of fast computing speeds, low power consumption, and the like, and is an ideal choice as the non-volatile memory for the next generation. RRAM is configured with a transition metal oxide (TMO) layer between two metal electrodes, and the RRAM undergoes electrical switching between a high resistance state (HRS) and a low resistance state (LRS) by changing the state of conductive filaments in the transition metal oxide layer.

However, the forming operation of RRAM depends on the series resistance in the device, and the magnitude of the external resistance can affect how much potential is distributed to the memory unit when a bias is applied to the entire RRAM. The conductive line structure and the memory unit of the conventional RRAM are not in direct contact with each other, and there are other conductive structures (such as vias) between the conductive line structure and the memory unit that provide higher contact resistance in the entire RRAM. This configuration makes the RRAM unable to perform the forming operation well (for example, the current difference between the high resistance state and the low resistance state during the forming operation of is too small), which may cause the RRAM to fail to switch properly.

BRIEF SUMMARY

The present disclosure provides a resistive random access memory which includes a conductive line structure and a memory unit. The conductive line structure is disposed in an array area and a periphery circuit area, respectively. The memory unit is disposed on the conductive line structure in the array area. The memory unit includes a lower electrode, a resistive switching layer, and an upper electrode. The lower electrode is disposed on the conductive line structure. The resistive switching layer is disposed on the lower electrode. The upper electrode is disposed on the resistive switching layer. An upper surface of the conductive line structure is in direct contact with the lower electrode.

The present disclosure provides a method for manufacturing a resistive random access memory. The method includes forming a conductive line structure in an array area and a periphery circuit area, respectively. The method further includes forming a memory unit on the conductive line structure in the array area. The forming of the memory unit includes forming a lower electrode on the conductive line structure, forming a resistive switching layer on the lower electrode, and forming an upper electrode on the resistive switching layer. The lower electrode of the memory unit is directly formed on an upper surface of the conductive line structure.

BRIEF DESCRIPTION OF THE DRAWINGS

FIGS. 1A~1H illustrate cross-sectional views of a resistive random access memory in a manufacturing process, in accordance with some embodiments of the present disclosure.

FIGS. 3A and 3B illustrate cross-sectional views of the resistive random access memory in a manufacturing process following FIG. 1H, in accordance with a second implementation of the present disclosure.

DETAILED DESCRIPTION

The present disclosure provides a resistive random access memory and a method for manufacturing the same, wherein a conductive line structure is in contact with a memory unit directly without going through a via, thereby this can reduce the series resistance within the resistive random access memory. As a result, since a forming operation may be performed well on the resulted resistive random access memory, it can be ensured that the resulted resistive random access memory has improved yield and performance. Moreover, since the formation of other conductive structures (such as vias) is omitted between the conductive line structure and the memory unit, while reducing the contact resistance within the resistive random access memory, it also simplifies the manufacturing process and reduces the cost. It is understood that the term "conductive line structure" in the text refers to one or more layers of conductive lines extending horizontally, but does not include vias or plugs extending vertically.

Figure 1A:
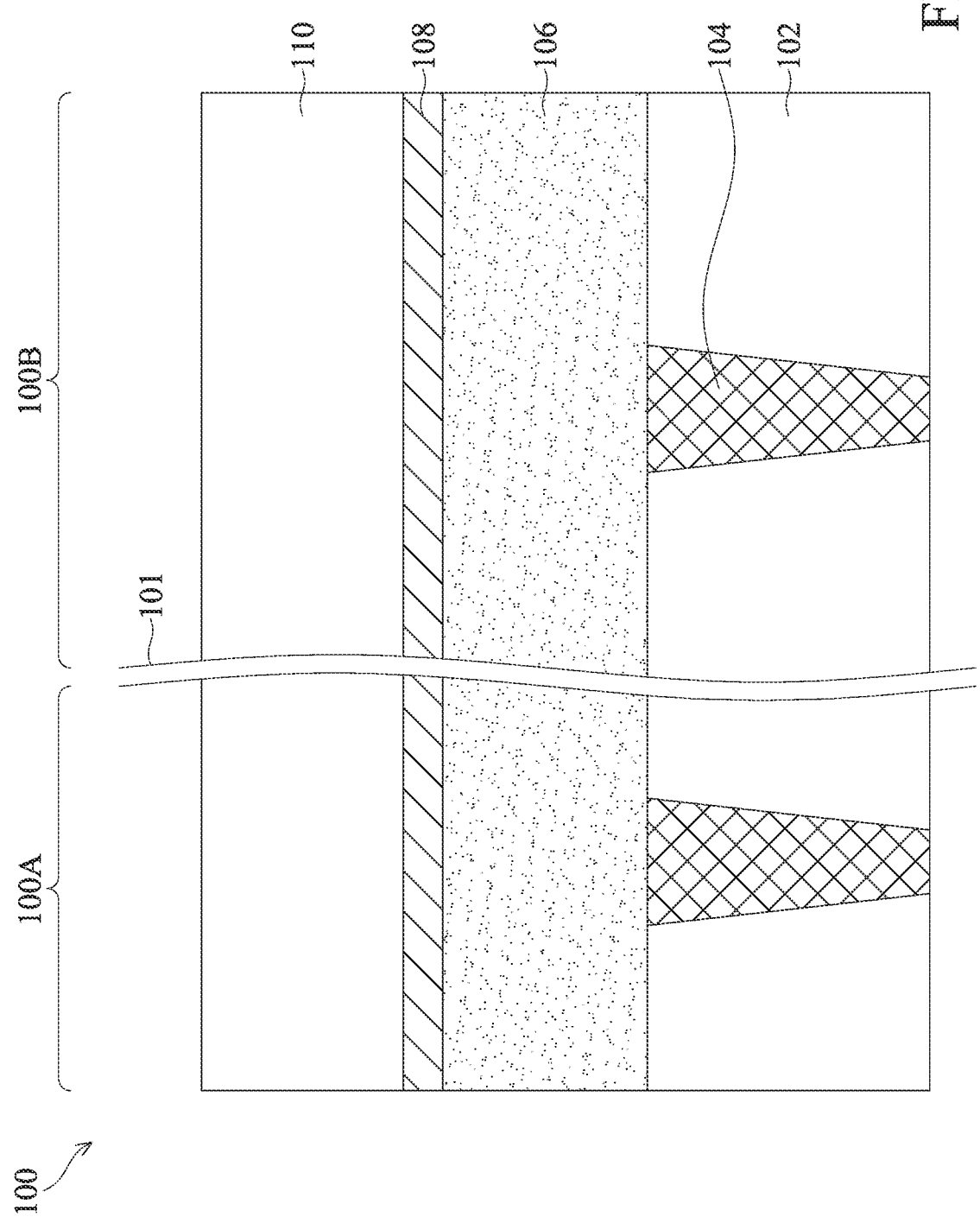

As shown in FIG. 1A, a semiconductor structure 100 includes an array area 100A and a periphery circuit area 100B divided by a divider 101, and a dielectric layer 102 is formed in both the array area 100A and the periphery circuit area 100B.

The material of the dielectric layer 102 includes an oxide, an nitride, a low-k dielectric material with a dielectric constant lower than about 3.9 or an extreme low-k (ELK) dielectric material with a dielectric constant lower than about 2, or a combination thereof. Specifically, the material of the dielectric layer 102 is, for example, silicon oxide, silicon oxynitride, phosphosilicate glass (PSG), borosilicate glass (BSG), borophosphosilicate glass (BPSG), undoped silicate glass (USG), fluorinated silicate glass (FSG), other suitable materials, or a combination thereof.

Then, a contact plug 104 may be formed in the dielectric layer 102 in the array area 100A and/or the periphery circuit area 100B, wherein the contact plug 104 in the array area 100A may electrically connect a subsequently formed resistive random access memory (such as resistive random access memory 200 or 300) to an underlying control element (not shown) for applying a bias. For example, the control element may be a transistor, and the contact plug 104 in the array area 100A may be electrically connected to a drain of the transistor. The contact plug 104 may include, for example, copper, tungsten, titanium, titanium nitride, aluminum, ruthenium, molybdenum, cobalt, other suitable conductive materials, or a combination thereof.

A masking layer (not shown) is disposed on the dielectric layer 102 and used as an etching mask to perform an etching process, thereby etching a contact opening in the dielectric layer 102. Then, the material of the contact plug 104 is filled into the opening, and a planarization process is performed to form the contact plug 104. For example, the masking layer may include a photoresist, such as a positive photoresist or a negative photoresist. The masking layer may include a hard mask, and may be formed of silicon oxide, silicon nitride, silicon oxynitride, silicon carbide, silicon carbonitride, similar materials or a combination thereof. The masking layer may be a single-layered or a multi-layered structure. The method for forming the masking layer may include a deposition process, a photolithography process, or the like. The aforementioned etching process may include a dry etching process, a wet etching process or a combination thereof. The method of filling the material of the contact plug 104 into the opening may include a physical vapor deposition (PVD) process, a chemical vapor deposition (CVD) process, an atomic layer deposition (ALD) process, evaporation or any suitable deposition processes. The material of the contact plug 104 may include copper, aluminum, tungsten or any suitable conductive materials.

Then, a lower conductive material layer 106 and an adhesion material layer 108 may be formed sequentially over the dielectric layer 102. By forming the adhesion material layer 108 on the lower conductive material layer 106, the adhesion or work function properties between the lower conductive material layer 106 and overlying conductive materials may be adjusted. The material of the lower conductive material layer 106 may include, for example, aluminum or other suitable conductive materials, and the material of the adhesion material layer 108 may include, for example, titanium, titanium nitride, other suitable materials, or a combination thereof. The method for forming the lower conductive material layer 106 and the adhesion material layer 108 may include PVD, CVD, ALD, e-beam evaporation, plating, or other suitable methods, or a combination thereof.

In some embodiments, the adhesion material layer 108 is a multi-layered structure. For example, the formation of the adhesion material layer 108 may include forming a titanium layer on the lower conductive material layer 106 and forming a titanium nitride layer on the titanium layer. It should be noted that although not illustrated, an adhesion material layer may also be formed between the contact plug 104 and the lower conductive material layer 106, thereby adjusting the adhesion or work function properties between the contact plug 104 and the lower conductive material layer 106.

Then, a masking material layer 110 may be formed over the lower conductive layer 106 and the adhesion material layer 108. The masking material layer 110 may include a material similar to the aforementioned masking layer. The method for forming the masking material layer 110 may include a CVD process, an ALD process, or any suitable deposition processes. In some embodiments, the masking material layer 110 may be formed using a nitride including silicon nitride, silicon oxynitride, silicon carbonitride, or a combination thereof. As a result, a mask formed with the above nitride (such as a patterned mask 112 in FIG. 1C) may be removed by wet etching in a following process.

Figure 1B:
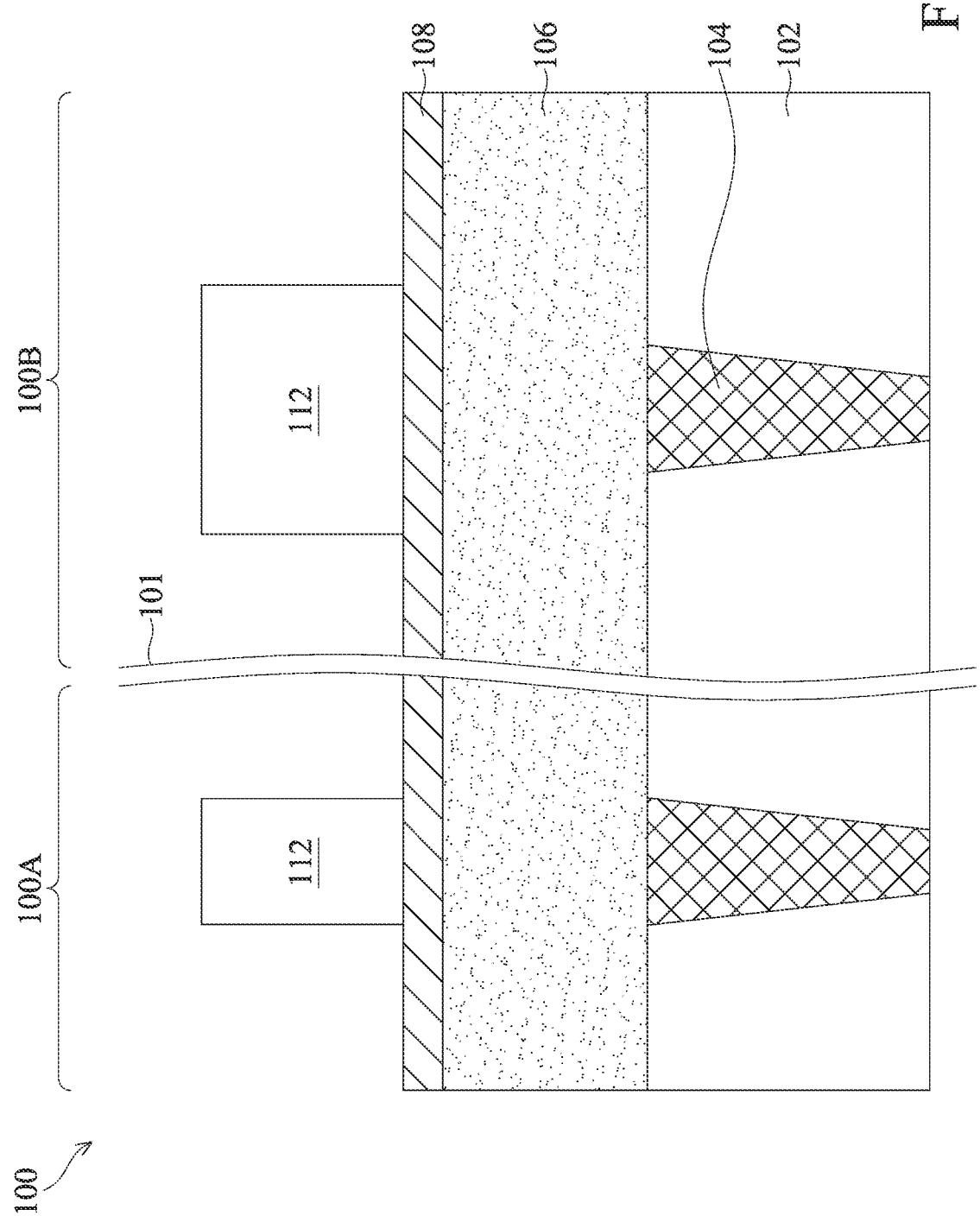

Referring to FIG. 1B, after forming the masking material layer 110, a portion of the masking material layer 110 may be removed by performing an etching process to form a patterned mask 112, wherein the etching process may include a dry etching process, a wet etching process or a combination thereof. In some embodiments, the formed patterned mask 112 corresponds to the position of the underlying contact plug 104.

Figure 1C:
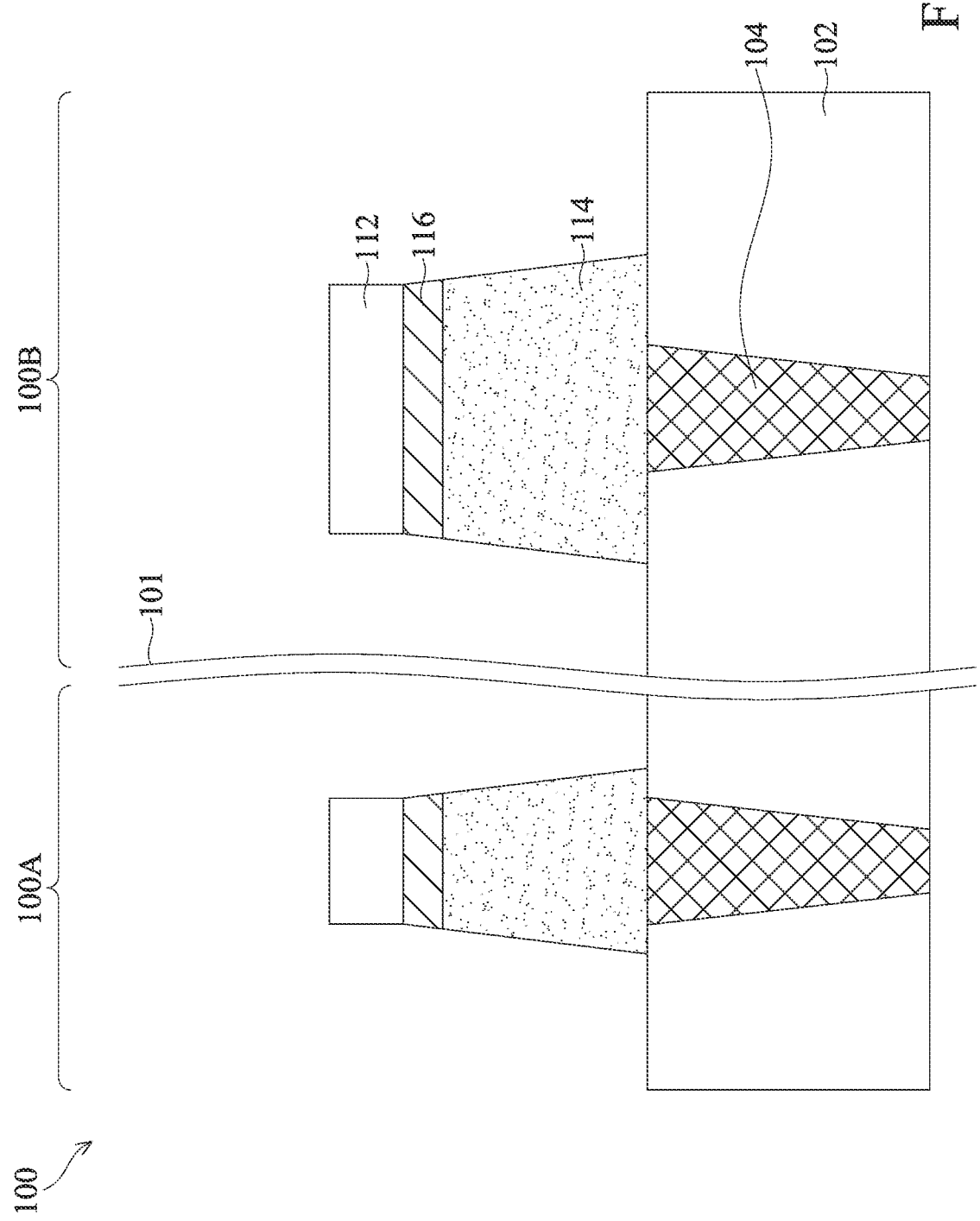

Referring to FIG. 1C, the patterned mask 112 is used as an etching mask, and the underlying adhesion material layer 108 and lower conductive material layer 106 are etched sequentially to form an adhesion layer 116 and a lower conductive layer 114, respectively. The etching process may include a dry etching process, a wet etching process or a combination thereof. Depending on the conditions of the etching process, in some embodiments, the formed lower conductive layer 114 and the adhesion layer 116 have inclined sidewalls, and the lower conductive layer 114 has an average width wider than the adhesion layer 116. As shown in FIG. 1C, the lower conductive layer 114 and the adhesion layer 116 have cross-sections that taper upward. In some embodiments, the lower conductive layer 114 and the adhesion layer 116 are a portion of the conductive line structure of the subsequently formed resistive random access memory.

Figure 1D:
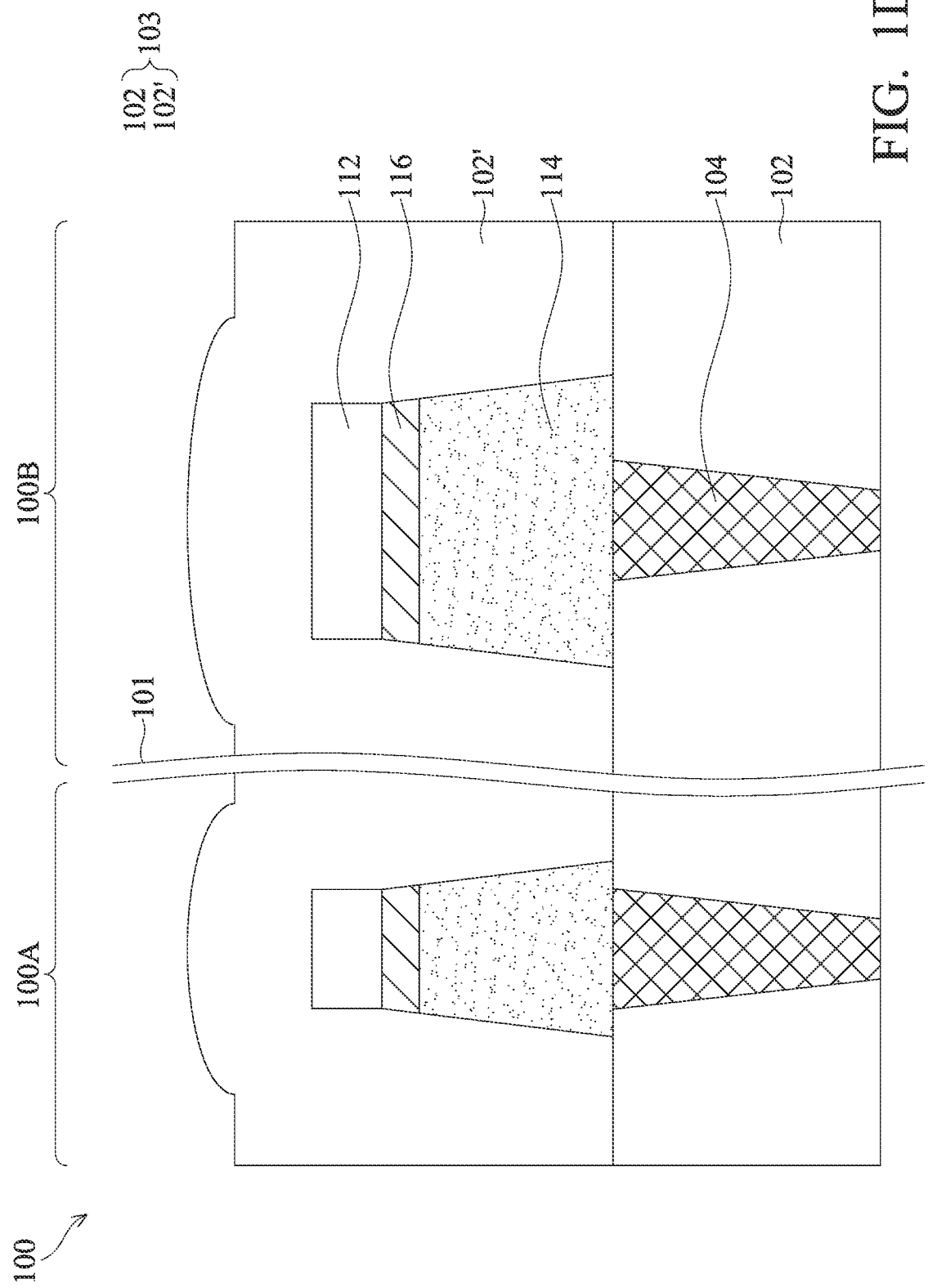

Referring to FIG. 1D, after forming the lower conductive layer 114 and the adhesion layer 116, another dielectric layer 102' may be deposited on the semiconductor structure 100. The dielectric layer 102' forms a dielectric layer 103 together with the underlying dielectric layer 102, wherein the dielectric layer 103 includes the material of the previously formed dielectric layer 102 and the material of the dielectric layer 102' deposited on the dielectric layer 102. Since the material and the forming method of the dielectric layer 102' may be similar to that of the dielectric layer 102, the detailed description is omitted herein for the sake of brevity. As shown in FIG. 1D, the dielectric layer 103 may fill the spaces surrounding the lower conductive layers 114 and cover the lower conductive layer 114, the adhesion layer 116, and the patterned mask 112. In some embodiments, if the desired conductive line structure has a shorter pitch, high density plasma chemical vapor deposition (HDP-CVD) may be performed to fill the dielectric layer 103, which prevents voids from being generated in the spaces between the lower conductive layers 114.

Referring to FIG. 1E, after forming the dielectric layer 103, to remove excess dielectric layer 103 and expose a top surface of the patterned mask 112, a planarization process such as a chemical mechanical polishing (CMP) process may be performed, such that the top surfaces of the patterned mask 112 and the dielectric layer 103 are substantially leveled. In other embodiments, an etch back process may be performed to substantially level the top surfaces of the patterned mask 112 and the dielectric layer 103.

Figure 1F:
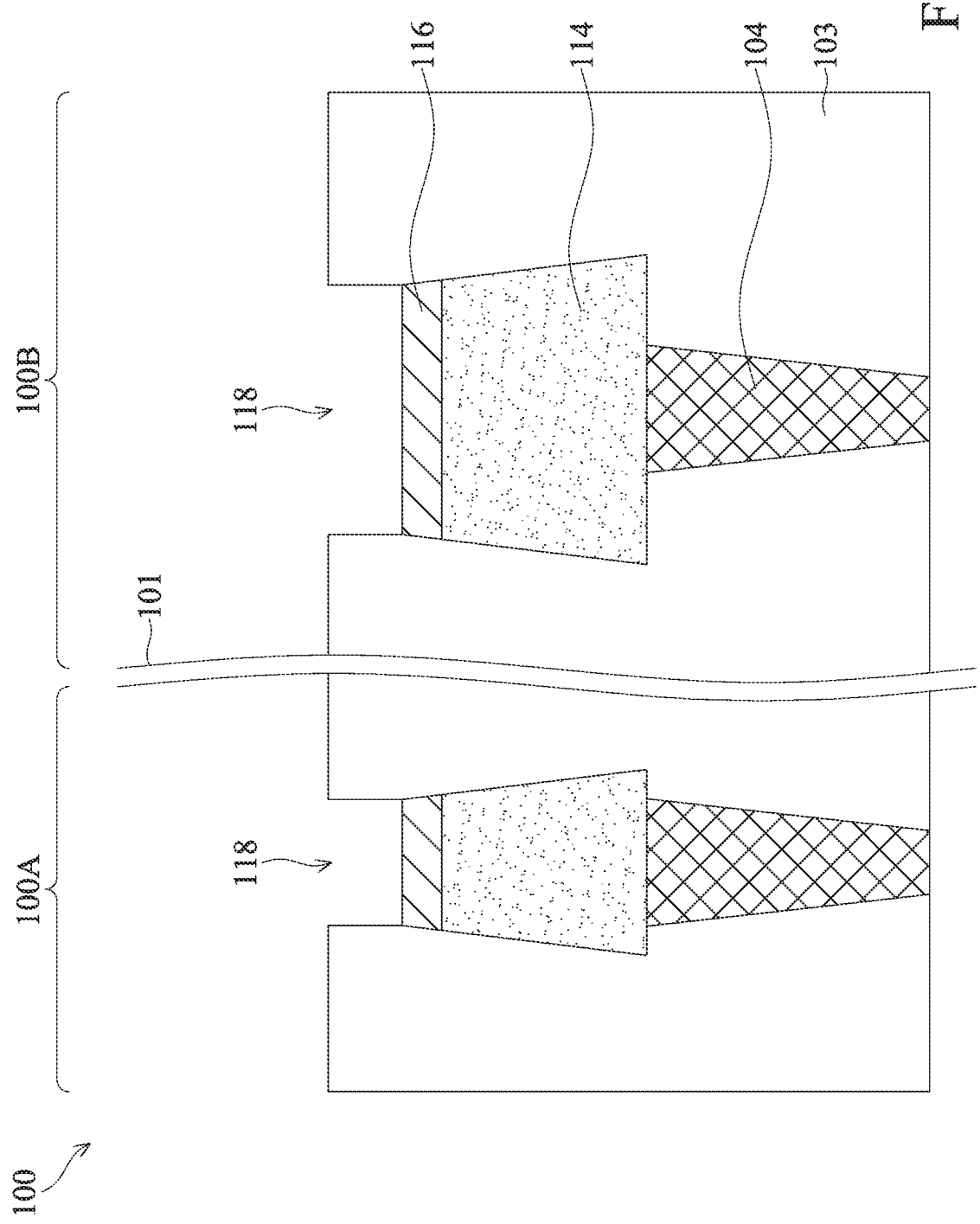

Referring to FIG. 1F, the patterned mask 112 is removed to form a trench 118 which exposes the adhesion layer 116. The removal may be performed by a wet etching process, and the utilized etchant includes hydrofluoric acid (HF), nitric acid ($HNO_3$), sulfuric acid ($H_2SO_4$), phosphoric acid ($H_3PO_4$), hydrochloric acid (HCl), ammonia ($NH_3$), other suitable etchants, or a combination thereof. In the embodiments where the material of the patterned mask 112 includes a nitride, a wet etching process utilizing, for example, hot phosphoric acid may be used to remove the patterned mask 112.

Figure 1G:
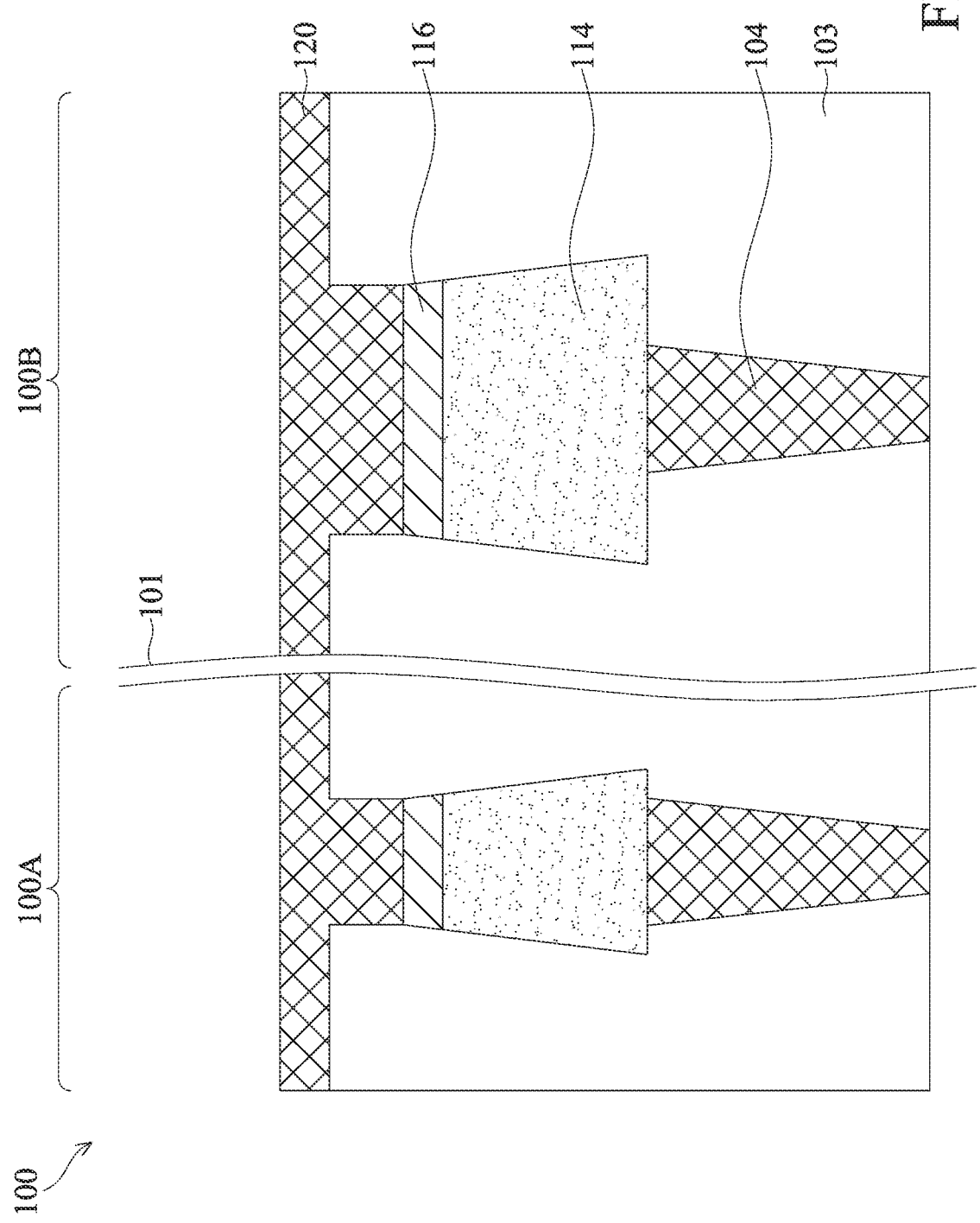

Referring to FIG. 1G, an upper conductive material layer 120 is formed in the trench 118 and over the dielectric layer 103. The upper conductive material layer 120 may include, for example, copper, tungsten, titanium, titanium nitride, aluminum, ruthenium, molybdenum, cobalt, other suitable conductive material, or a combination thereof. The method for forming the upper conductive material layer 120 may include PVD, CVD, ALD, e-beam evaporation, plating, or other suitable methods, or a combination thereof.

Figure 1H:
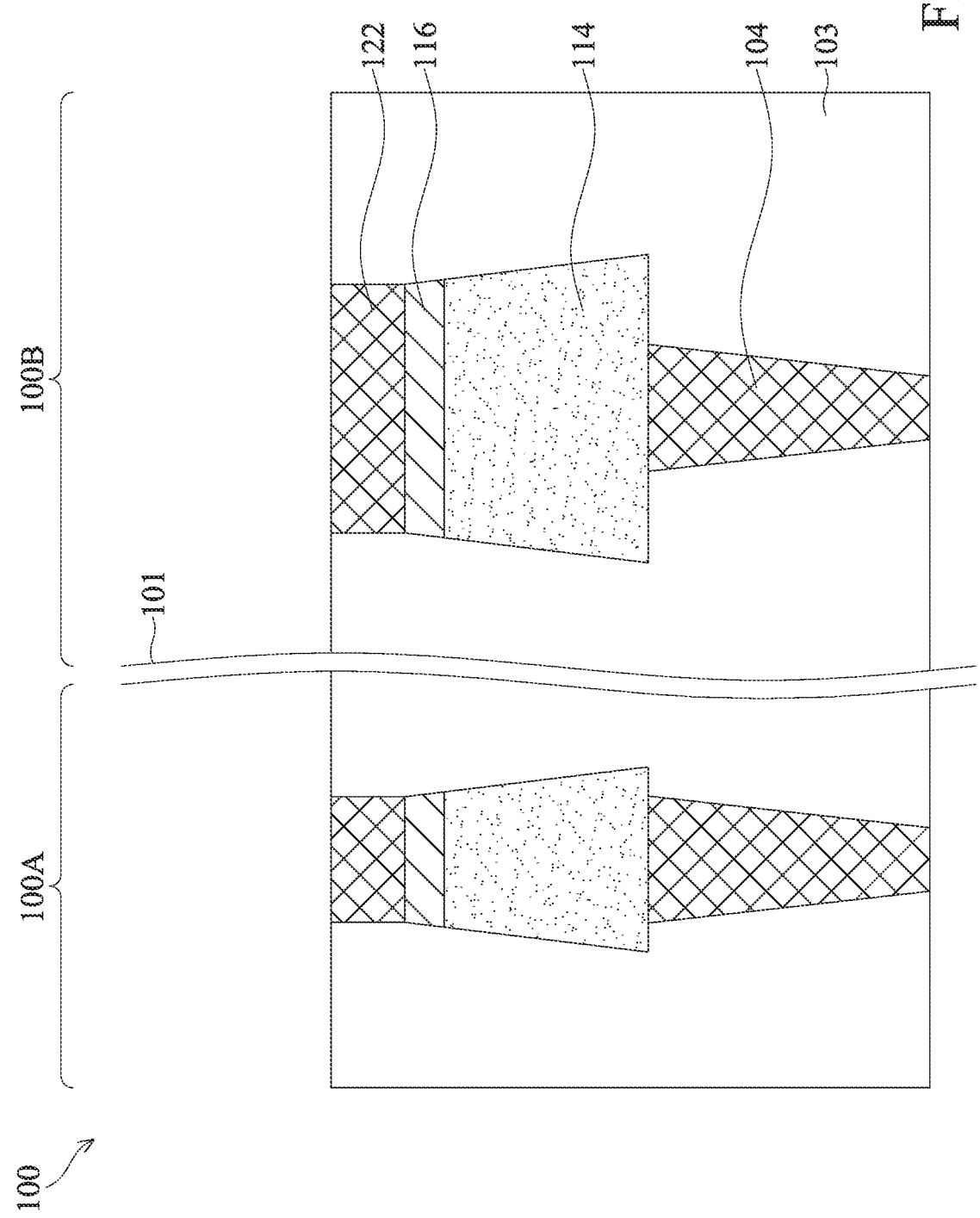

Referring to FIG. 1H, after forming the upper conductive material layer 120, a suitable etch back process or a planarization process may be performed to remove excess upper conductive material layer 120, thereby forming an upper conductive layer 122. As shown in FIG. 1H, the formed upper conductive layer 122 may have a width that substantially corresponds to the widths of the underlying lower conductive layer 114 and adhesion layer 116. The adhesion layer 116 is disposed between the upper conductive layer 122 and the lower conductive layer 114. It should be noted that the upper conductive layer 122 is used as a topmost layer of the conductive line structure in a first implementation of the subsequently formed resistive random access memory (such as the resistive random access memory 200), and the upper conductive layer 122 is used as a lower electrode of the memory unit in a second implementation of the subsequently formed resistive random access memory (such as the resistive random access memory 300).

Figure 2A:
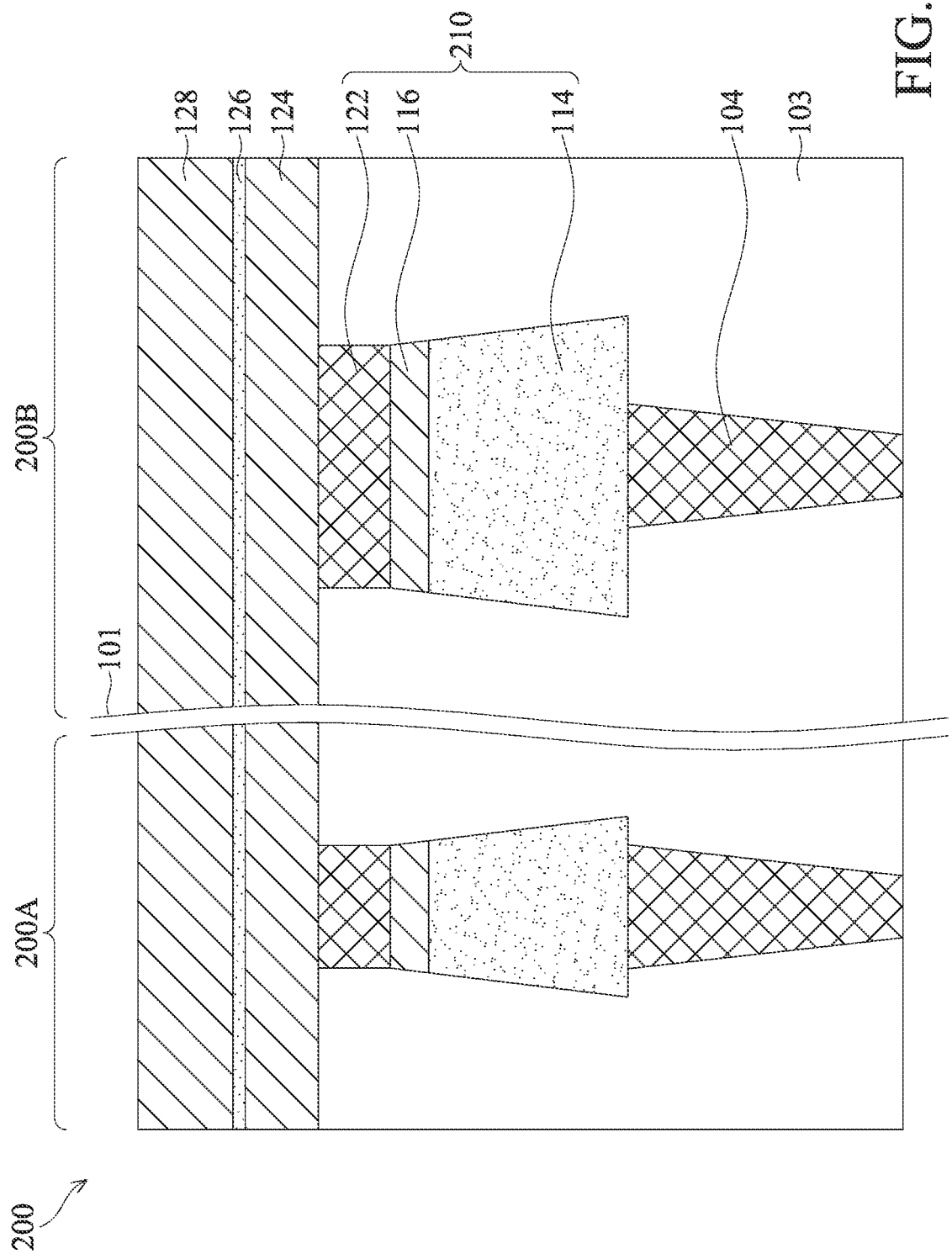
FIGS. 2A and 2B illustrate cross-sectional views of the resistive random access memory in a manufacturing process following FIG. 1H, in accordance with a first implementation of the present disclosure.
Figure 2B:
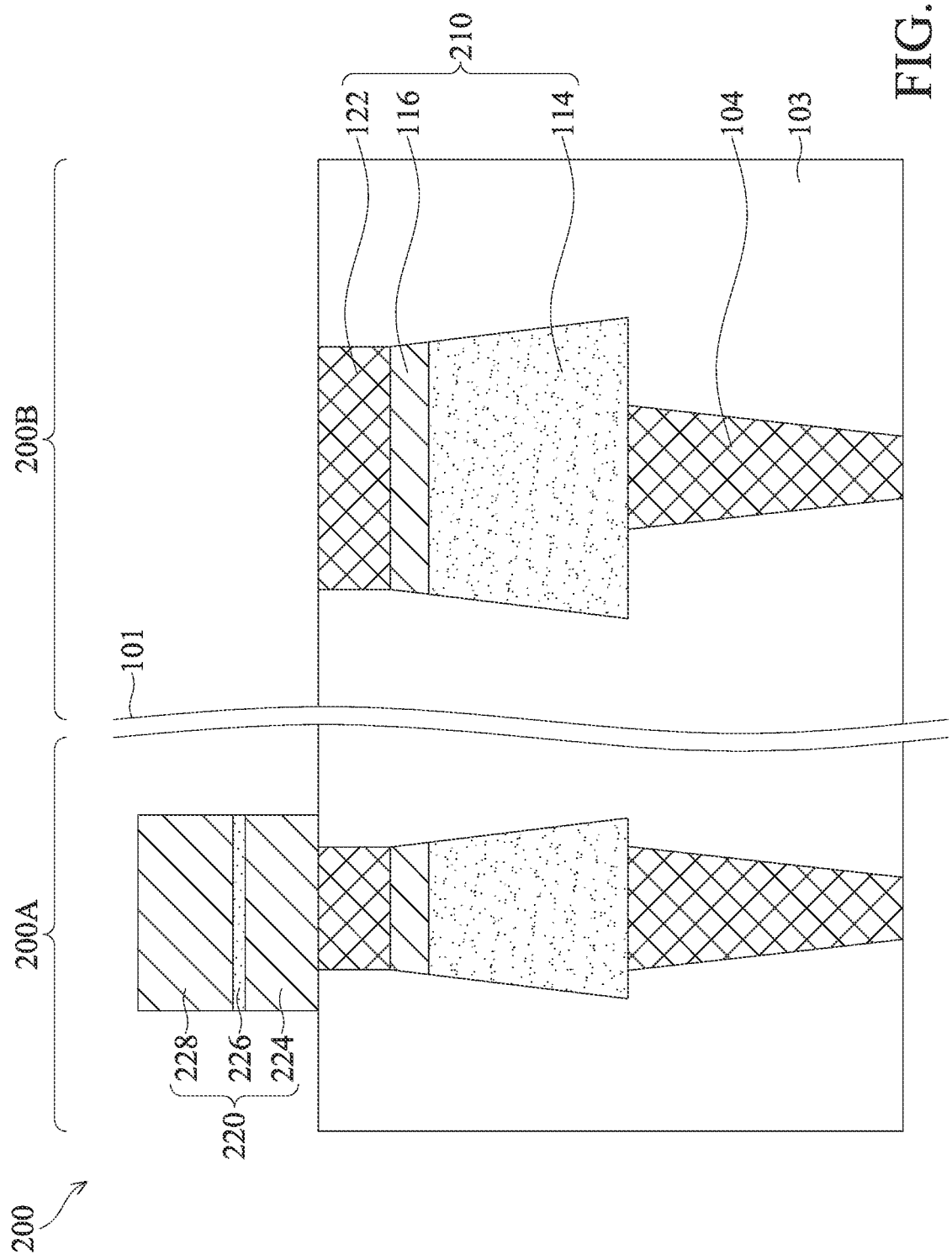

FIGS. 2A and 2B illustrate cross-sectional views of the resistive random access memory in a manufacturing process following FIG. 1H, in accordance with the first implementation of the present disclosure. Referring to FIG. 2A, after forming the upper conductive layer 122, a lower electrode layer 124, a metal oxide layer 126, and an upper electrode 128 are sequentially formed over the upper conductive layer 122 and the dielectric layer 103, and the lower electrode layer 124 is formed directly on an upper surface of the upper conductive layer 122. The material of the lower electrode layer 124 and the upper electrode layer 128 may include platinum, titanium nitride, gold, titanium, tantalum, tantalum nitride, tungsten, tungsten nitride, copper, other suitable materials, or a combination thereof, and the lower electrode layer 124 and the upper electrode layer 128 may each include a single-layered structure or a multi-layered structure. The material of the metal oxide layer 126 may include a transition metal oxide, such as nickel oxide, titanium oxide, hafnium oxide, zirconium oxide, zinc oxide, tungsten oxide, aluminum oxide, tantalum oxide, molybdenum oxide, copper oxide, other suitable materials, or a combination thereof.

Referring to FIG. 2B, after the lower electrode layer 124, the metal oxide layer 126, and the upper electrode layer 128 are sequentially formed, a patterning process is performed to remove the lower electrode layer 124, the metal oxide layer 126, and the upper electrode layer 128 in a periphery circuit area 200B, thereby forming a lower electrode 224, a resistive switching layer 226, and an upper electrode 228 in an array area 200A, respectively.

As shown in FIG. 2B, the resulted resistive random access memory 200 includes a conductive line structure 210 and a memory unit 220, wherein the upper surface of the conductive line structure 210 is in direct contact with the lower electrode 224 of the memory unit 220. In some embodiments, via is not formed between the conductive line structure 210 and the memory unit 220. It is understood that in this implementation, the conductive line structure 210 includes the lower conductive layer 114, the adhesion layer 116, and the upper conductive layer 122, and the memory unit 220 includes the lower electrode 224, the resistive switching layer 226, and the upper electrode 228 in the array area 200A.

In this implementation, since the memory unit 220 may be formed in a single patterning process, the lower electrode 224, the resistive switching layer 226, and the upper electrode 228 may have sidewalls that are substantially coplanar. In addition, since the formation of other conductive structures (such as vias) is omitted between the conductive line structure 210 and the memory unit 220, while reducing the contact resistance within the resistive random access memory 200, it also simplifies the manufacturing process and reduces the cost.

Figure 3A:
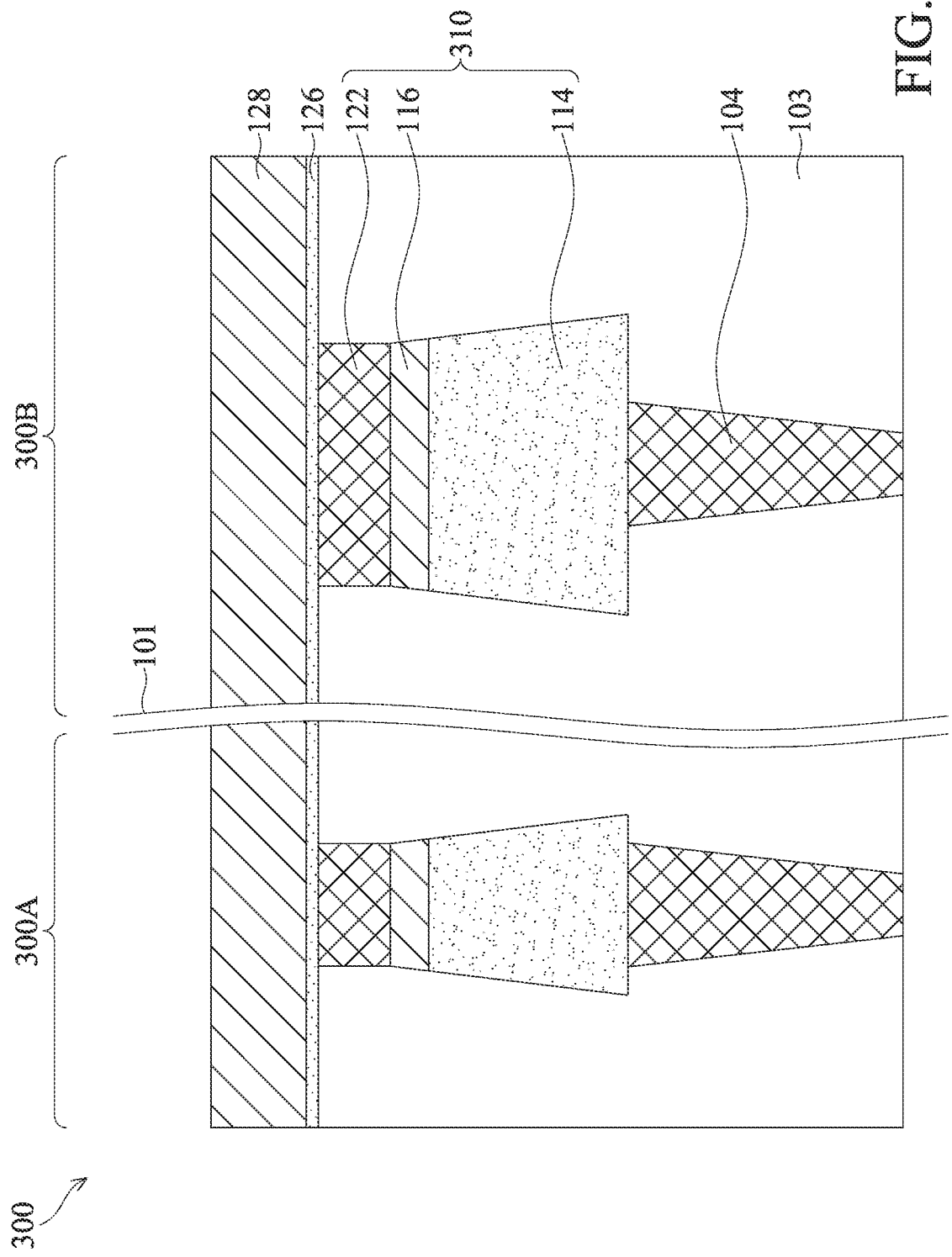

FIGS. 3A and 3B illustrate cross-sectional views of the resistive random access memory in a manufacturing process following FIG. 1H, in accordance with the second implementation of the present disclosure. Referring to FIG. 3A, after forming the upper conductive layer 122, a metal oxide layer 126 and an upper electrode 128 are sequentially formed over the upper conductive layer 122 and the dielectric layer 103, and the metal oxide layer 126 is formed directly on an upper surface of the upper conductive layer 122. The material of the upper electrode layer 128 may include platinum, titanium nitride, gold, titanium, tantalum, tantalum nitride, tungsten, tungsten nitride, copper, other suitable materials, or a combination thereof, and the upper electrode layer 128 may include a single-layered structure or a multi-layered structure. The material of the metal oxide layer 126 may include a transition metal oxide, such as nickel oxide, titanium oxide, hafnium oxide, zirconium oxide, zinc oxide, tungsten oxide, aluminum oxide, tantalum oxide, molybdenum oxide, copper oxide, other suitable materials, or a combination thereof. In some embodiments, a nitridation or oxidation treatment may be performed on the upper conductive layer 122 before forming the metal oxide layer 126 and the upper electrode layer. Therefore, the redox reaction to the metal oxide layer 126 (and the subsequently formed resistive switching layer 326) can be reduced to prevent the device from failing to undergo transition.

Referring to FIG. 3B, after the metal oxide layer 126 and the upper electrode layer 128 are sequentially formed, a patterning process is performed to remove the metal oxide layer 126 and the upper electrode layer 128 in a periphery circuit area 300B, thereby forming a resistive switching layer 326, and an upper electrode 328 in an array area 300A, respectively. In addition, in some embodiments, sidewalls of the upper electrode 328 and the resistive switching layer 326 are substantially coplanar, and the widths of the upper electrode 328 and the resistive switching layer 326 are wider than the width of the upper conductive layer 122.

As shown in FIG. 3B, the resulted resistive random access memory 300 includes a conductive line structure 310 and a memory unit 320, wherein the upper surface of the conductive line structure 310 is in direct contact with the upper conductive layer 122 of the memory unit 320. The upper conductive layer 122 functions as a lower electrode of the memory unit 320. In some embodiments, via is not formed between the conductive line structure 310 and the memory unit 320. It is understood that in this implementation, the conductive line structure 310 of the array area 300A includes the lower conductive layer 114 and the adhesion layer 116, but does not include the upper conductive layer 122, and the conductive line structure 310 of the periphery circuit area 300B includes the lower conductive layer 114, the adhesion layer 116, and the upper conductive layer 122. In addition, the memory unit 320 includes the upper conductive layer 122, the resistive switching layer 326, and the upper electrode 328 in the array area 300A, wherein the upper conductive layer 122 is used as a lower electrode of the memory unit 320. As shown in FIGS. 3A and 3B, in some embodiments, a sidewall of the upper conductive layer 122 used as the lower electrode corresponds the sidewall of the conductive line structure 310.

In this implementation, the upper conductive layer 122 is buried in a trench in the dielectric layer 103 corresponding to the conductive line structure 310, and the upper conductive layer 122 as the lower electrode may be formed directly on the upper surface of the adhesion layer 116, so that the upper surface of the adhesion layer 116 is in direct contact with the upper conductive layer 122. Since the upper conductive layer 122 is used as the lower electrode of the memory unit 320 directly, and the formation of other layers is omitted between the upper conductive layer 122 and the resistive switching layer 326, while further reducing the contact resistance within the resistive random access memory 300, it also simplifies the manufacturing process and reduces the cost.

Specifically, when a forward voltage is applied to the resistive random access memories 200 and 300, the oxygen ions in the resistive switching layers 226 and 326 migrate to the electrode above, and oxygen vacancy conductive filaments are formed in the resistive switching layers 226 and 326, so that the resistive switching layers 226 and 326 are converted to the low resistance state. Conversely, when a reverse voltage is applied to the resistive random access memories 200 and 300, the oxygen ions return to the resistive switching layers 226 and 326 and combine with the oxygen-vacancies in the resistive switching layers 226 and 326, resulting in the disappearance of the oxygen vacancy conductive filaments, so that the resistive switching layers 226 and 326 are converted to the high resistance state. The resistive random access memories 200 and 300 convert their resistance value in the aforementioned manner to store or read data to achieve the memory function.

In summary, the present disclosure provides a resistive random access memory an a method for manufacturing the same, wherein a conductive line structure is in contact with a memory unit directly, thereby reducing the series resistance within the resistive random access memory. As a result, since a forming operation may be performed well on the resulted resistive random access memory, it can be ensured that the resulted resistive random access memory has improved yield and performance. Moreover, since the formation of other conductive structures (such as vias) is omitted between the conductive line structure and the memory unit, while reducing the contact resistance within the RRAM, it also simplifies the manufacturing process and reduces the cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a resistive random access memory, comprising:
    forming a conductive line structure in an array area and a periphery circuit area, respectively, wherein the conductive line comprises one or more layers of conductive lines extending horizontally and is free of vias or plugs extending vertically, wherein the formation of the conductive line structure comprises:
        forming a lower conductive layer; and
        forming an adhesion layer on the lower conductive layer, wherein forming the lower conductive layer and the adhesion layer comprises:
            sequentially forming a lower conductive material layer and an adhesion material layer;
            forming a patterned mask over the lower conductive layer and the adhesion material layer; and
            etching the adhesion material layer and the lower conductive material layer with the patterned mask to form the adhesion layer and the lower conductive layer, respectively;
    depositing a dielectric layer to cover the patterned mask;
    planarizing the dielectric layer to expose the patterned mask;
    removing the patterned mask to form a trench, wherein the trench exposes the adhesion layer; and
    forming a memory unit on the conductive line structure in the array area, wherein the forming the memory unit comprises:
        forming a lower electrode on the conductive line structure;
        forming a resistive switching layer on the lower electrode; and
        forming an upper electrode on the resistive switching layer,
    wherein the lower electrode of the memory unit is formed directly on an upper surface of the conductive line structure.

2. The method for manufacturing a resistive random access memory as claimed in claim 1, wherein no via is formed between the conductive line structure and the memory unit.

3. The method for manufacturing a resistive random access memory as claimed in claim 1, wherein the patterned mask comprises silicon nitride, polysilicon, or a combination thereof.

4. The method for manufacturing a resistive random access memory as claimed in claim 1, wherein the patterned mask is removed by a wet etching process.

5. The method for manufacturing a resistive random access memory as claimed in claim 1, wherein the formation of the conductive line structure further comprises forming an upper conductive layer on the adhesion layer in the trench, and the lower electrode is formed directly on an upper surface of the upper conductive layer.

6. The method for manufacturing a resistive random access memory as claimed in claim 5, further comprising:
    sequentially forming a lower electrode layer, a metal oxide layer, and an upper electrode layer on the conductive line structure; and
    performing a patterning process to remove the lower electrode layer, the metal oxide layer, and the upper electrode layer in the periphery circuit area, thereby forming the lower electrode, the resistive switching layer, and the upper electrode.

7. The method for manufacturing a resistive random access memory as claimed in claim 1, further comprising forming the lower electrode in the trench, wherein the lower electrode is formed directly on an upper surface of the adhesion layer.

8. The method for manufacturing a resistive random access memory as claimed in claim 7, further comprising:
    sequentially forming a metal oxide layer and an upper electrode layer on the lower electrode; and
    performing a patterning process to remove the metal oxide layer and the upper electrode layer in the periphery circuit area, thereby forming the resistive switching layer and the upper electrode, respectively.

9. The method for manufacturing a resistive random access memory as claimed in claim 7, wherein sidewalls of the upper electrode and the resistive switching layer are coplanar, and widths of the upper electrode and the resistive switching layer are larger than a width of the lower electrode.

* * * * *